United States Patent
Ma

(10) Patent No.: US 12,242,202 B2
(45) Date of Patent: *Mar. 4, 2025

(54) METHOD FOR OVERLAY ERROR CORRECTION

(71) Applicant: NANYA TECHNOLOGY CORPORATION, New Taipei (TW)

(72) Inventor: Shih-Yuan Ma, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 641 days.

This patent is subject to a terminal disclaimer.

(21) Appl. No.: 17/568,151

(22) Filed: Jan. 4, 2022

(65) Prior Publication Data

US 2023/0213874 A1 Jul. 6, 2023

(51) Int. Cl.
*G03F 7/00* (2006.01)

(52) U.S. Cl.
CPC .................... *G03F 7/70633* (2013.01)

(58) Field of Classification Search
CPC ................................... G03F 7/70633
USPC ......................................... 430/22
See application file for complete search history.

(56) References Cited

U.S. PATENT DOCUMENTS

| | | | |
|---|---|---|---|
| 9,747,682 B2 | 8/2017 | Lee et al. | |
| 11,137,692 B2 | 10/2021 | Feler et al. | |
| 11,796,924 B2 * | 10/2023 | Ma | G03F 7/706837 |
| 2004/0066517 A1 | 4/2004 | Huang et al. | |
| 2004/0072083 A1 | 4/2004 | Saitou et al. | |
| 2007/0069398 A1 | 3/2007 | Smith et al. | |
| 2016/0334208 A1 | 11/2016 | Liou et al. | |
| 2021/0382402 A1 | 12/2021 | Ma et al. | |

FOREIGN PATENT DOCUMENTS

| | | |
|---|---|---|
| TW | 201915599 A | 4/2019 |
| TW | 202113463 A | 4/2021 |
| TW | I749985 B | 12/2021 |
| TW | 202201139 A | 1/2022 |
| WO | WO02/19415 A1 | 3/2002 |

OTHER PUBLICATIONS

TW Office Action corresponding ot Application No. 11220302630 dated Mar. 30, 2023.

* cited by examiner

*Primary Examiner* — Christopher G Young
(74) *Attorney, Agent, or Firm* — MUNCY, GEISSLER, OLDS & LOWE, P.C.

(57) ABSTRACT

The present disclosure provides a method for overlay error correction. The method includes: obtaining an overlay error based on a lower-layer pattern and an upper-layer pattern of a wafer, wherein the lower-layer pattern is obtained by first fabrication equipment through which the wafer passes, and the upper-layer pattern is obtained by exposure equipment; generating a corrected overlay error based on the overlay error and fabrication processes performed on the wafer after the first fabrication equipment and prior to the exposure equipment; and adjusting the exposure equipment based on the corrected overlay error.

19 Claims, 14 Drawing Sheets

METHOD FOR OVERLAY ERROR CORRECTION

TECHNICAL FIELD

The present disclosure relates to a method using the aforesaid mark to correct overlay errors.

DISCUSSION OF THE BACKGROUND

As the semiconductor industry develops, reducing overlay errors in photoresist patterns and underlying patterns in lithography operations is becoming much more important. Since correctly measuring overlay errors has become more difficult due to various factors such as asymmetric shapes of measurement structures, a new overlay mark and method which can more precisely measure overlay errors is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure.

One aspect of the present disclosure provides a mark for overlay correction. The mark includes a first pattern and a second pattern. The first pattern is disposed on a substrate and at a first horizontal level. The first pattern includes a plurality of first sub-patterns and a plurality of second sub-patterns. The first sub-patterns extend along a first direction and are arranged along a second direction different from the first direction. The second sub-patterns are arranged along the second direction, wherein a profile of each of the plurality of to first sub-patterns is different from a profile of each of the plurality of second sub-patterns. The second pattern is disposed at a second horizontal level different from the first horizontal level.

Another aspect of the present disclosure provides a method for overlay error correction. The method includes: obtaining an overlay error based on a lower-layer pattern and an upper-layer pattern of a wafer, wherein the lower-layer pattern is obtained by first fabrication equipment through which the wafer passes, and the upper-layer pattern is obtained by exposure equipment; generating a corrected overlay error based on the overlay error and fabrication processes performed on the wafer after the first fabrication equipment and prior to the exposure equipment; and adjusting the exposure equipment based on the corrected overlay error.

Another aspect of the present disclosure provides a method for overlay error correction. The method includes: receiving a wafer having a substrate; forming a first pattern on the substrate of the wafer; performing a plurality of fabrication processes on the wafer; forming, by exposure equipment, a second pattern on the first pattern of the wafer; obtaining an overlay error based on the first pattern and the second pattern of the wafer; generating a corrected overlay error based on the overlay error and the plurality of fabrication processes; and adjusting the exposure equipment based on the corrected overlay error.

The embodiments of the present disclosure disclose an overlay mark for overlay error measurement. The pre-layer of the overlay mark can include different sub-patterns so that correction data can be generated from each of the sub-patterns. Selecting correction data from a specific sub-pattern can refine a correction overlay error, resulting in the corrected overlay error being more in accordance with actual fact.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
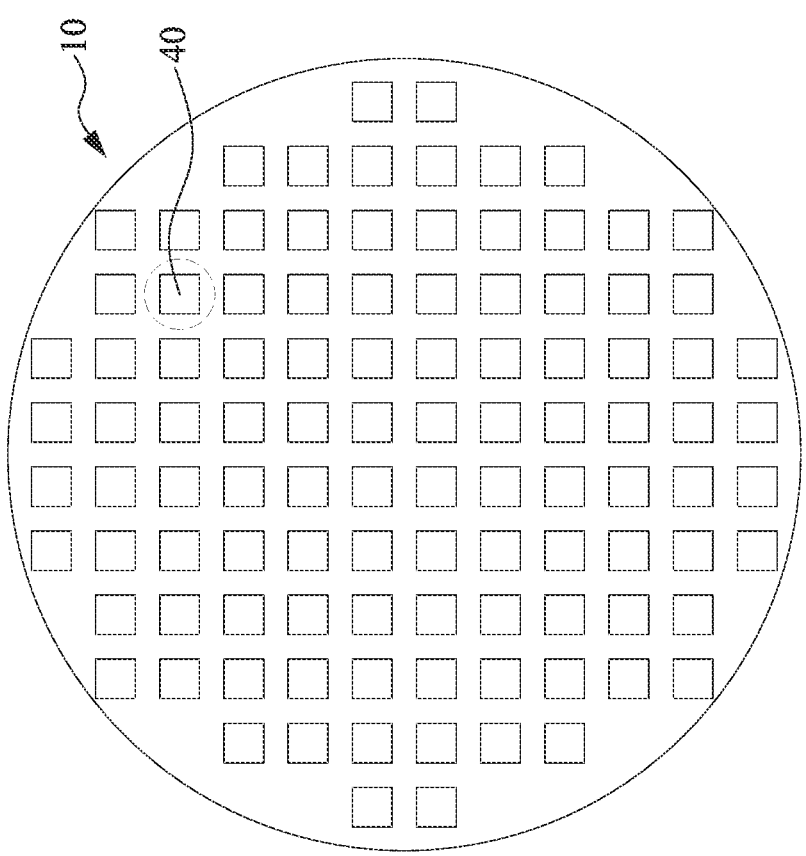
FIG. 1 is a top view of a wafer, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
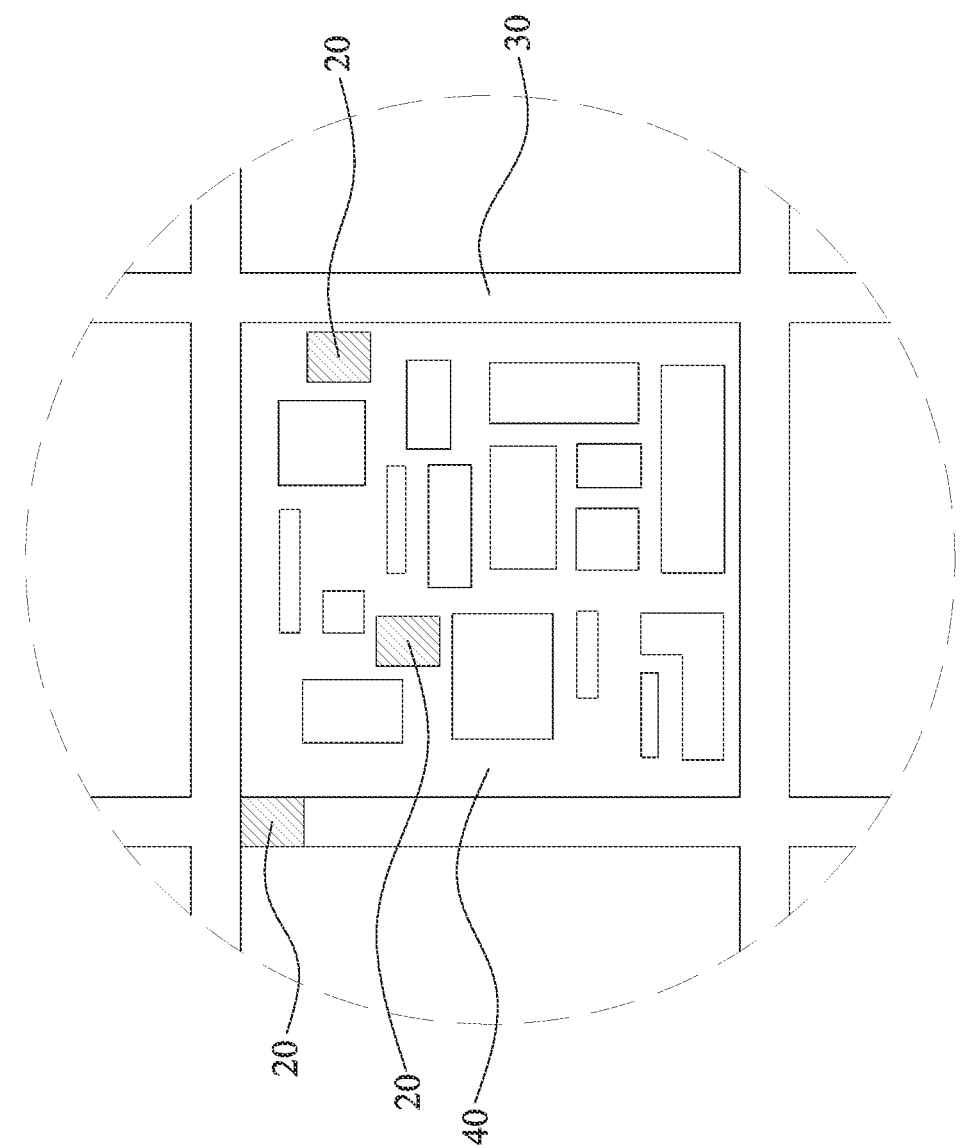
FIG. 2 is an enlargement view of a dotted region as shown in FIG. 1, in accordance with some embodiments of the present disclosure.

Referring to FIG. 1 and FIG. 2, FIG. 1 is a top view of a wafer 10 according to various aspects of the present disclosure, and FIG. 2 is a top view of the enlargement of a dotted region in FIG. 1.

As shown in FIG. 1 and FIG. 2, the wafer 10 is sawed along scribe lines 30 into a plurality of dies 40. Each of the dies 40 may include semiconductor devices, which can include active components and/or passive components. The active component may include a memory die (e.g., dynamic random access memory (DRAM) die, a static random access memory (SRAM) die, etc.)), a power management die (e.g., power management integrated circuit (PMIC) die)), a logic die (e.g., system-on-a-chip (SoC), central processing unit (CPU), graphics processing unit (GPU), application processor (AP), microcontroller, etc.)), a radio frequency (RF) die, a sensor die, a micro-electro-mechanical-system (MEMS) die, a signal processing die (e.g., digital signal processing (DSP) die)), a front-end die (e.g., analog front-end (AFE) dies)) or other active components. The passive component may include a capacitor, a resistor, an inductor, a fuse or other passive components.

In some embodiments, the overlay mark 20 can be located on the scribe lines 20. The overlay mark 20 can be disposed at the corner of an edge of each of the dies 40. In some embodiments, the overlay mark can be located inside the dies 40. The overlay marks 20 can be used to measure whether the current layer, such as an opening of a photoresist layer, is precisely aligned with a pre-layer in the semiconductor fabrication process.

Figure 3:
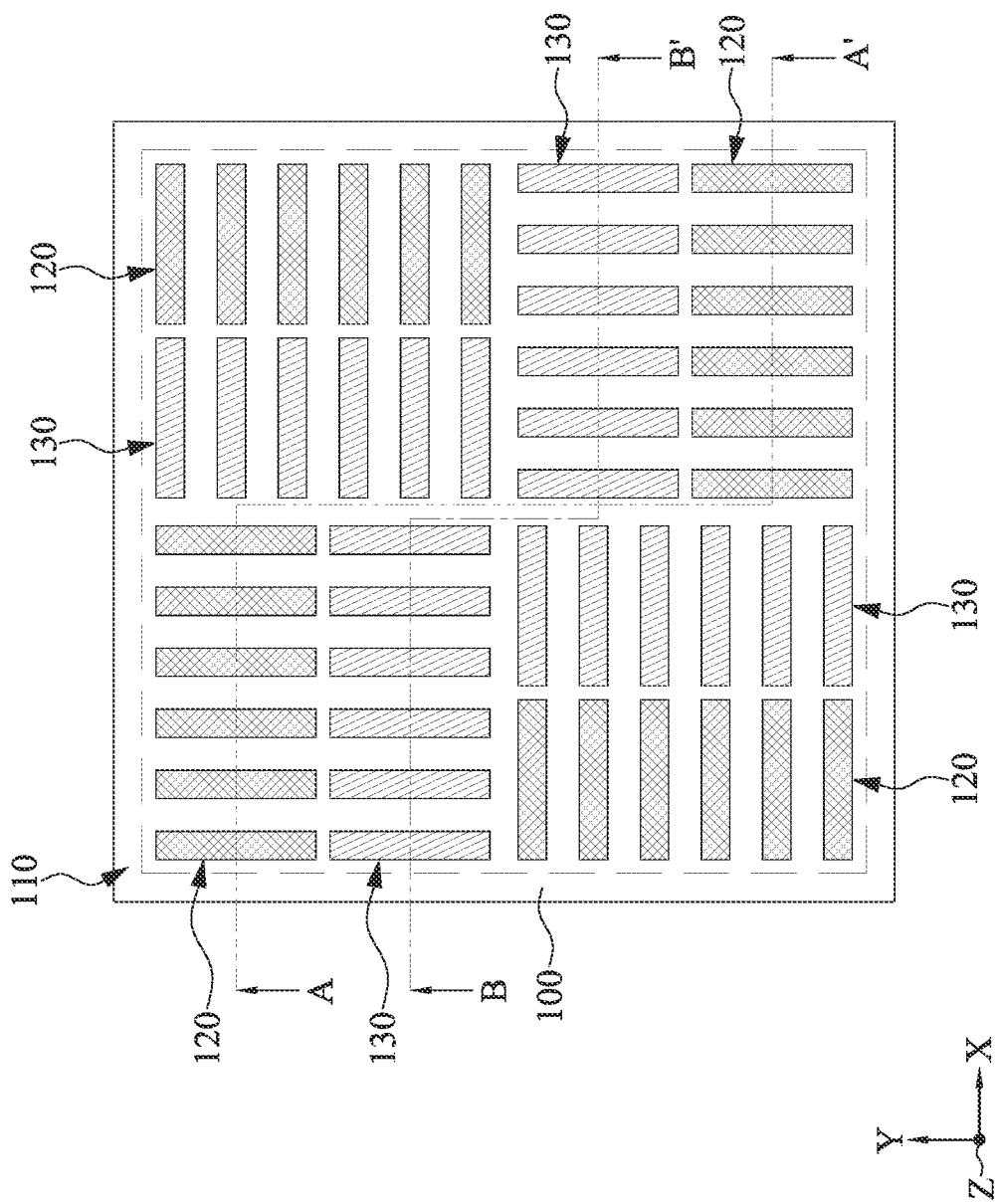
FIG. 3 is a top view of an overlay mark, in accordance with some embodiments of the present disclosure.

FIG. 3 is a top view of an overlay mark 110 for aligning different layers over a substrate 100 according to various aspects of the present disclosure. As shown in FIG. 3, a semiconductor device structure, such as a wafer, can include the overlay mark 110 over the substrate 100.

The substrate 100 may be a semiconductor substrate, such as a bulk semiconductor, a semiconductor-on-insulator (SOI) substrate, or the like. The substrate 100 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 100 may have a multilayer structure, or the substrate 100 may include a multilayer compound semiconductor structure.

The overlay mark 110 can include patterns 120 and patterns 130 over the substrate 100. The pattern 120 can be a pre-layer's pattern. The pattern 130 can be a current layer's pattern. The pre-layer (or a lower-layer) can be located at a horizontal level different from that of the current layer (or an upper-layer). Each of the patterns 120 (or patterns 130) can be located in one of four quadrature targets areas, two of which are utilized to measure the overlay error of the X direction, and two of which are utilized to measure the overlay error of the Y direction.

While measuring an overlay error using an overlay mark, such as the overlay mark 110, an X-directional deviation is measured along a straight line in an X direction of the overlay mark 110. A Y-directional deviation is further measured along a straight line in a Y direction of the overlay mark 110. One single overlay mark, including the patterns 120 and the patterns 130, can be used to measure one X- and one Y-directional deviation between two layers on a substrate. Therefore, whether the current layer and the pre-layer are precisely aligned can be determined according to the X- and Y-directional deviations. The overlay error may include the X-directional deviation ($\Delta X$), the Y-directional deviation ($\Delta Y$), or the combination of both.

Figure 4A:
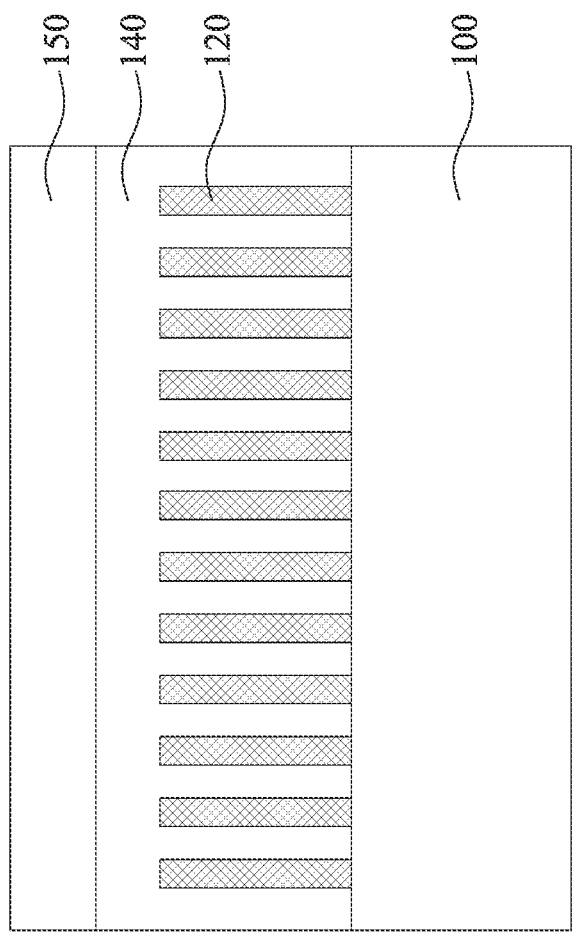
FIG. 4A is a cross-sectional view along line A-A' of FIG. 3, in accordance with some embodiments of the present disclosure.

FIG. 4A is a cross-sectional view taken along a cutting line A-A' of FIG. 3.

As shown in FIG. 3 and FIG. 4A, the pattern 120 can be disposed on the substrate 100. The pattern 120 can be disposed in an intermediate structure 140. In some embodiments, the pattern 120 may include a material the same as that of tut isolation structure. In some embodiments, the pattern 120 may be disposed at an elevation the same as that of the isolation structure. The isolation structure can include, for example, a shallow trench isolation (STI), a field oxide (FOX), a local-oxidation of silicon (LOCOS) feature, and/or other suitable isolation elements. The isolation structure can include a dielectric material such as silicon oxide, silicon nitride, silicon oxy-nitride, fluoride-doped silicate (FSG), a low-k dielectric material, combinations thereof, and/or other suitable materials.

In some embodiments, the pattern 120 can include a material the same as that of a gate structure. The gate structure can be sacrificial, for example, such as a dummy gate structure. In some embodiments, the pattern 120 can be disposed at an elevation the same as that of the gate structure. In some embodiments, the pattern 120 can include a dielectric layer of which the material is the same as that of a gate dielectric layer and a conductive layer of which the material is the same as that of a gate electrode layer.

In some embodiments, the gate dielectric layer can include silicon oxide ($SiO_x$), silicon nitride ($Si_xN_y$), silicon oxynitride (SiON), or a combination thereof. In some embodiments, the gate dielectric layer can include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the gate electrode layer can include a polysilicon layer. In some embodiments, the gate electrode layer can be made of a conductive material, such as aluminum (Al), copper (Cu), tungsten (W), titanium (Ti), tantalum (Ta), or other applicable materials. In some embodiments, the gate electrode layer can include a work function layer. The work function layer is made of a metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure. The gate electrode layer can be formed by low-pressure chemical vapor deposition (LPCVD) and plasma-enhanced CVD (PECVD).

In some embodiments, the pattern 120 can include a material the same as that of a conductive via, which can be disposed on a conductive trace, such as the first metal layer (M1 layer). In this embodiment, the pattern 120 can include a barrier layer and a conductive layer surrounded by the barrier layer. The barrier layer can include metal nitride or other suitable materials. The conductive layer can include metals, such as W, Ta, Ti, Ni, Co, Hf, Ru, Zr, Zn, Fe, Sn, Al, Cu, Ag, Mo, Cr, alloy or other suitable materials. In this embodiment, the pattern 120 can be formed by suitable deposition processes such as, for example, sputter and physical vapor deposition (PVD).

The intermediate structure 140 can include one or more intermediate layers made of insulating material, such as silicon oxide or silicon nitride. In some embodiments, the intermediate structure 140 can include conductive layers, such as metal layers or alloy layers. In some embodiments, the one or more intermediate layers can be formed by a suitable film forming method, such as chemical vapor deposition (CVD), atomic layer deposition (ALD) or physical vapor deposition (PVD). After the intermediate layers are formed, a thermal operation, such as rapid thermal annealing, can be performed. In other embodiments, a planarization operation, such as a chemical mechanical polishing (CMP) operation, is performed. In other embodiments, a removal operation, such as an etching process, can be performed. The etching process can include, for example, a dry etching process or a wet etching process. It is understood that additional operations can be provided before, during, and after processes as set forth above, and some of the operations described above can be replaced or eliminated, for additional embodiments of the method. The order of the operations/processes may be interchangeable.

Figure 4B:
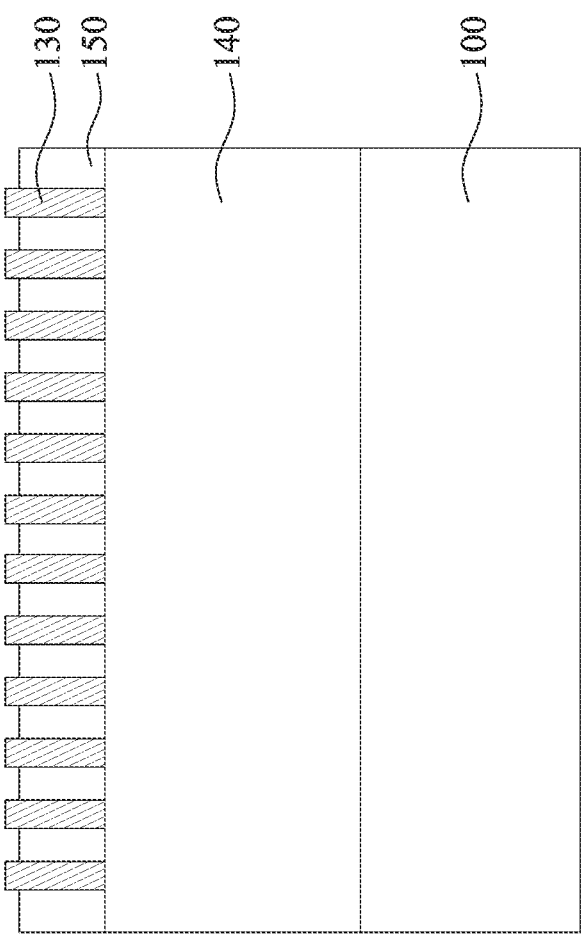
FIG. 4B is a cross-sectional view along line B-B' of FIG. 3, in accordance with some embodiments of the present disclosure.

FIG. 4B is a cross-sectional view taken along a cutting line B-B' of FIG. 3.

As shown in FIG. 3 and FIG. 4B, the pattern 130 is disposed on the intermediate structure 140. In some embodiments, the pattern 130 can be a plurality of openings defined by a mask 150. The mask 150 can be formed on the intermediate structure 140, and will be removed in subsequent processes. The mask 150 can include a positive-tone or negative-tone photoresist such as a polymer, or a hard mask such as silicon nitride or silicon oxy-nitride. The current layer, including the mask 150 and the patterns 130, can be patterned using suitable photolithography processes such as, for example, forming a photoresist layer over the intermediate structure 140, exposing the photoresist layer to a pattern by a reticle, baking and developing the photoresist to form the mask 150 and the patterns 130. The mask 150 may then be used to define a pattern into the intermediate structure 140 such that the portion of the intermediate structure 140 exposed to the pattern 130 can be removed.

Since multiple semiconductor fabrication processes are performed subsequent to the formation of the patterns 120, the profile of the patterns 120 may be deformed and has an asymmetric profile. The deformed patterns 120 may cause an overlay error estimation with a relatively large deviation.

Figure 5:
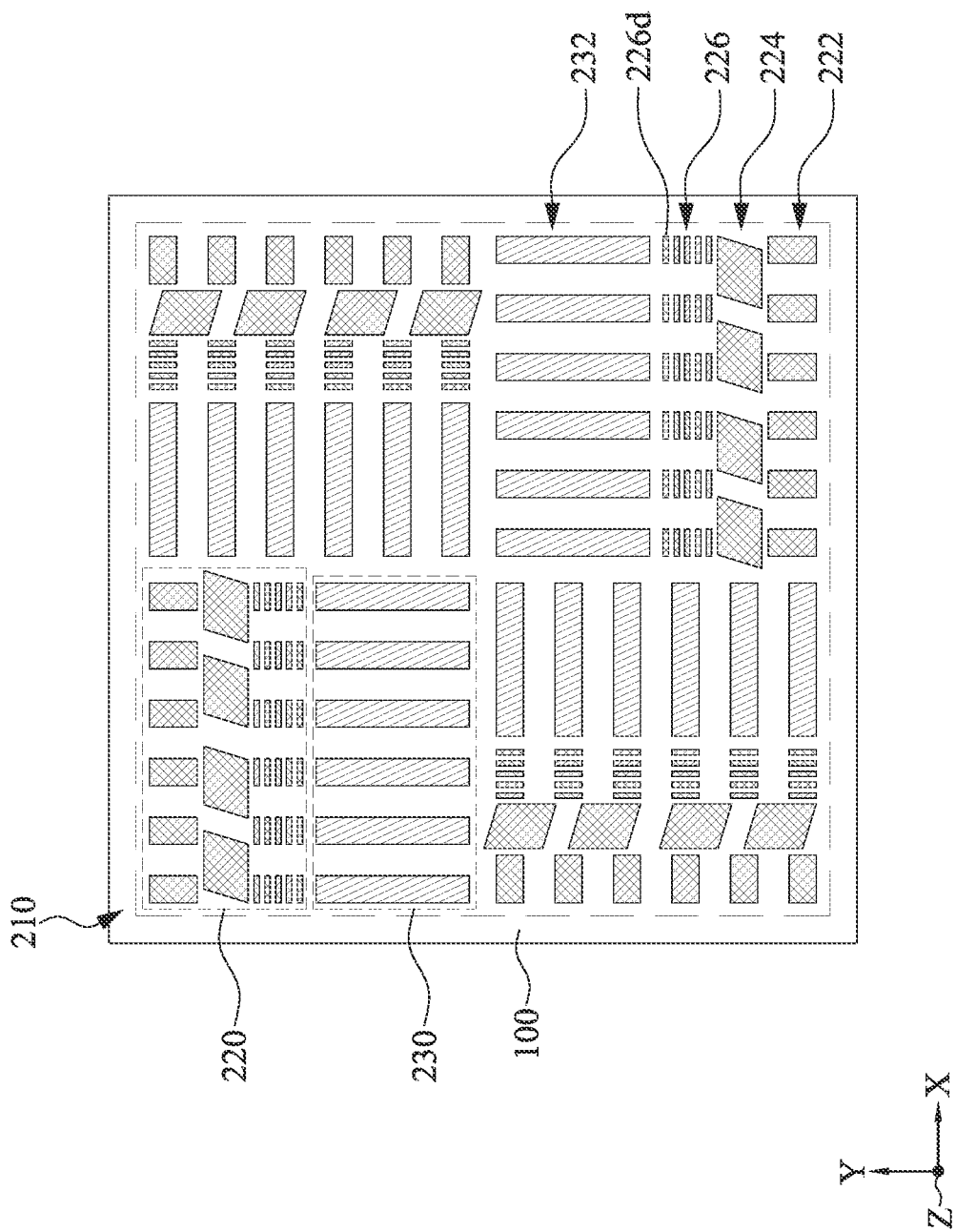
FIG. 5 is a top view of an overlay mark, in accordance with some embodiments of the present disclosure.

FIG. 5 is a top view of an overlay mark 210, in accordance with some embodiments of the present disclosure.

The overlay mark 210 can include various features over the substrate 100, such as patterns 220 and patterns 230. The pattern 220 can be a pre-layer's pattern. The pattern 230 can be a current layer's pattern. The pre-layer (or a lower-layer) can be located at a horizontal level different from that of the current layer (or an upper layer). Each of the patterns 220 (or patterns 230) can be located in one of four quadrature targets areas, two of which are utilized to measure the overlay error of the X direction, and two of which are utilized to measure the overlay error Y direction.

In some embodiments, the patterns 220 can include a material the same as that of an isolation feature and can be located at an elevation the same as that of the isolation feature. In some embodiments, the patterns 220 can include a material the same as that of a gate structure and can be located at an elevation the same as that of the gate structure. In some embodiments, the patterns 220 can include a material the same as that of a conductive via and can be located at an elevation the same as that of the conductive via.

In some embodiments, each of the patterns 220 can have a plurality of sub-patterns 222, sub-patterns 224, and sub-patterns 226. In some embodiments, each of the sub-patterns 222, 224, and 226 can have different profiles, in a plain view. In some embodiments, each of the sub-patterns 222, 224, and 226 can have different sizes (e.g., the surface area in a plain view).

Each of the sub-patterns 222 can extend along a first direction, such as the Y direction. The plurality of sub patterns 222 can be arranged along a second direction, such as the X direction. In some embodiments, each of the sub-patterns 222 can have, for example, a rectangle profile.

The plurality of sub-patterns 224 can be arranged along the second direction. Each of the sub-patterns 224 can extend along a third direction, which is slanted with respect to the X direction and the Y direction. For example, the sub-patterns 224 can have a first edge and a second edge slanted with respect to the first edge. The first edge can extend along the second direction, and the second edge can extend along the third direction. In some embodiments, the sub-pattern 224 can be slanted with respect to the sub-pattern 222. In some embodiments, the size of the sub-pattern 224 can be greater than (or exceed) that of the sub-pattern 222. In some embodiments, the pitch of the plurality of sub-patterns 224 can be greater than that of the plurality of the sub-pattern 222 along the second direction. In some embodiments, the number of the sub-patterns 224 can be different from the number of the sub-patterns 222. In some embodiments, the number of the sub-patterns 224 can be less than the number of the sub-patterns 222. In some embodiments, each of the sub-patterns 224 can have, for example, a parallelogram profile.

The plurality of sub-patterns 226 can be arranged along the second direction. Each of the sub-patterns 226 can have a plurality of segments 226d arranged along the first direction. In some embodiments, each of the segments 226d can have a size less than that of each of the sub-patterns 222. In some embodiments, the pitch of the plurality of sub-patterns 226 can be the same as that of the plurality of sub-patterns 222 along the second direction. In some embodiments, the segments of a sub-pattern 226 can have, for example, a rectangle profile. Although FIG. 5 illustrates that the sub-patterns 224 are disposed between the sub-patterns 222 and 226, the relative location between the sub-patterns 222, 224, and 226 can be modified. For example, the sub-patterns 222 can be disposed between the sub-patterns 224 and 226 in other embodiments.

The patterns 230 can have a plurality of sub-patterns 232. Each of the sub-patterns 232 can extend along the first direction. The plurality of sub-patterns 232 can be arranged along the second direction. In some embodiments, the length of the sub-pattern 232 can be greater than that of the sub-pattern 222 along the first direction. In some embodiments, the pitch of the plurality of sub-patterns 232 can be the same as the pitch of the plurality of sub-patterns 222 along the second direction, in some embodiments, the pitch of the plurality of sub-patterns 232 can be less than the pitch of the plurality of sub-patterns 224 alone the second direction. In some embodiments, each of the sub-patterns 232 can have, for example, a rectangle profile. In some embodiments, the pattern 220 can be composed of sub-patterns with two or more different profiles, and the pattern 230 can be composed of sub-patterns with a single profile.

Although not shown in FIG. 5, it should be noted that an intermediate structure can be disposed to cover the patterns 220, and that the patterns 230 are disposed over the intermediate structure.

While measuring an overlay error using an overlay mark, such as the overlay mark 210, an X-directional deviation is measured along a straight line in an X direction of the overlay mark 210. A Y-directional deviation is further measured along a straight line in a Y direction of the overlay mark 210. One single overlay mark, including the patterns 220 and 230, can be used to measure one X- and one Y-directional deviation between two layers on a substrate. Whether the current layer and the pre-layer are precisely aligned can be determined according to the X- and Y-directional deviations. The overlay error may include the X-directional deviation ($\Delta X$), the Y-directional deviation ($\Delta Y$), or the combination of both.

More specifically, the images of the patterns 220 and 230 obtained from overlay measurement equipment can be used to calculate overlay errors. As discussed above, multiple semiconductor fabrication processes are performed subsequent to the formation of the patterns 220; the profile of the patterns 220 may be deformed and has an asymmetric profile. In order to obtain an overlay error more in accordance with actual fact, the overlay error, obtained from the overlay measurement equipment, can be further corrected. An overlay correction system can receive the information of optical images from the pre-layer's pattern and the current layer's pattern, and then generates a plurality of correction data corresponding to each of the respective correction parameters. The overlay correction system can thus generate a corrected overlay error. Then, a controller (e.g., a computer) will send a signal indicating how to adjust the exposure equipment based on the corrected overlay error. As a result, the exposure equipment, used to define the patterns 230, will be adjusted according to the corrected overlay error. In some embodiments, the correction data can be configured to generate an X-directional offset value, a Y-directional offset value, or the combination of both, which is used to compensate for an overlay error.

Since one or more semiconductor fabrication processes will be performed on the wafer after the formation of the pre-layer, the profile of the overlay mark in the pre-layer may be deformed and have an asymmetric profile due to different processes, such as a deposition process, an etching process, a chemical mechanical polishing process, or other processes. Thus, the overlay error based on these deformed patterns of the pre-layer may have a deviation with respect to actual fact. It is found that each unit of the correction data may have a different degree of errors according to patterns with different profiles. That is, one group of correction data may have a smaller error (or a deviation with respect to actual fact) based on a pattern A, and have a greater error based on a pattern B, the profile of which is different from that of the pattern A. Another group of correction data may have an opposite result: having a greater error based on the pattern A, and having a smaller error based on the pattern B.

For example, an overlay correction system can include multiple groups of correction parameters, such as inter-field expansion and inter-field rotation. If an etching process is performed after the formation of the pre-layer, the correction data, generated from the correction parameters related to inter-field expansion, generated from the sub-pattern 224 can have a smaller error with respect to actual fact. If a chemical mechanical polishing is performed after the formation of the pre-layer, the correction data, generated from the correction parameters related to inter-field rotation, generated from the sub-pattern 226 can have a smaller error with respect to actual fact. The correction data, generated from the correction parameters not belonging to inter-field expansion and inter-field rotation, generated from the sub-pattern 222 can have a smaller error with respect to actual fact. A corrected overlay error with a smaller deviation can be estimated by selecting the correction data which have a smaller deviation with respect to actual fact.

As discussed above, the correction data from different patterns (or sub-patterns) may have different degrees of errors. In the embodiments of the present disclosure, the pre-layer may include patterns with different profiles, each of which can be used to generate a series of respective correction data. These correction data, from different sub-patterns, can be selected to obtain a corrected overlay error with a smaller deviation with respect to actual fact. The exposure equipment will be adjusted based on this corrected overlay error, and the accuracy of the alignment between the pre-layer and the current layer will be refined in the next semiconductor fabrication processes.

Figure 6:
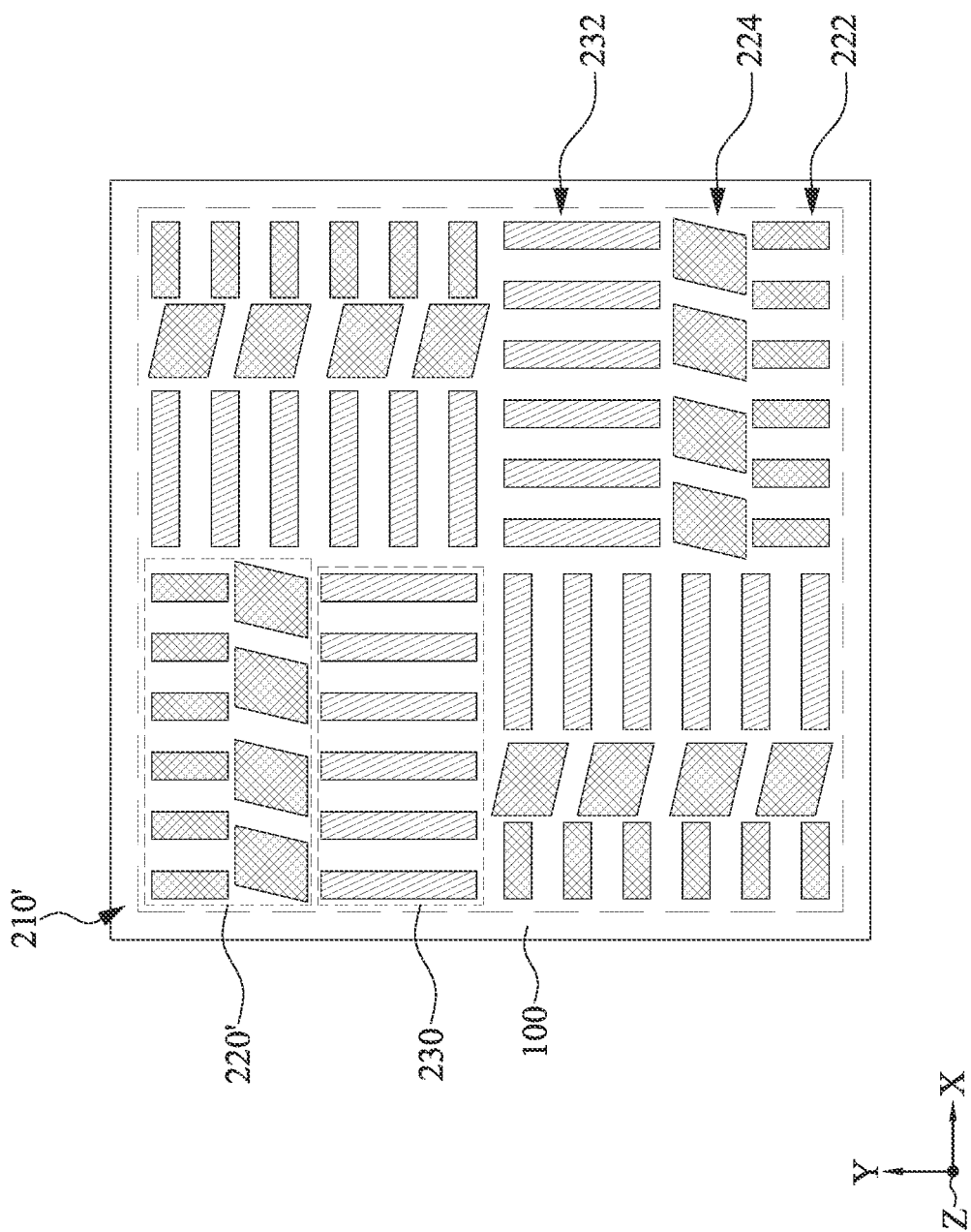
FIG. 6 is a top view of an overlay mark, in accordance with some embodiments of the present disclosure.

FIG. 6 is a top view of an overlay mark 210', in accordance with some embodiments of the present disclosure.

The overlay mark 210' shown in FIG. 6 can be similar to the overlay mark 210 shown in FIG. 5, differing in the composition of the patterns 220'. In some embodiments, the CMP process can be omitted after the formation of the pre-layer, and the patterns 220' can be composed of the sub-patterns 222 and the 224. In this embodiment, the correction parameters, not belonging to inter-field expansion, can be selected from the sub-pattern 222 to generate the correction data.

As discussed above, the correction data from different patterns (or sub-patterns) may have different degrees of errors. In this embodiment, the pre-layer can include patterns with different profiles, which can be used to generate a corrected overlay error with a smaller deviation with respect to actual fact. The exposure equipment will be adjusted based on this corrected overlay error, and the accuracy of the alignment between the pre-layer and the current layer will be refined in the next semiconductor fabrication processes.

Figure 7:
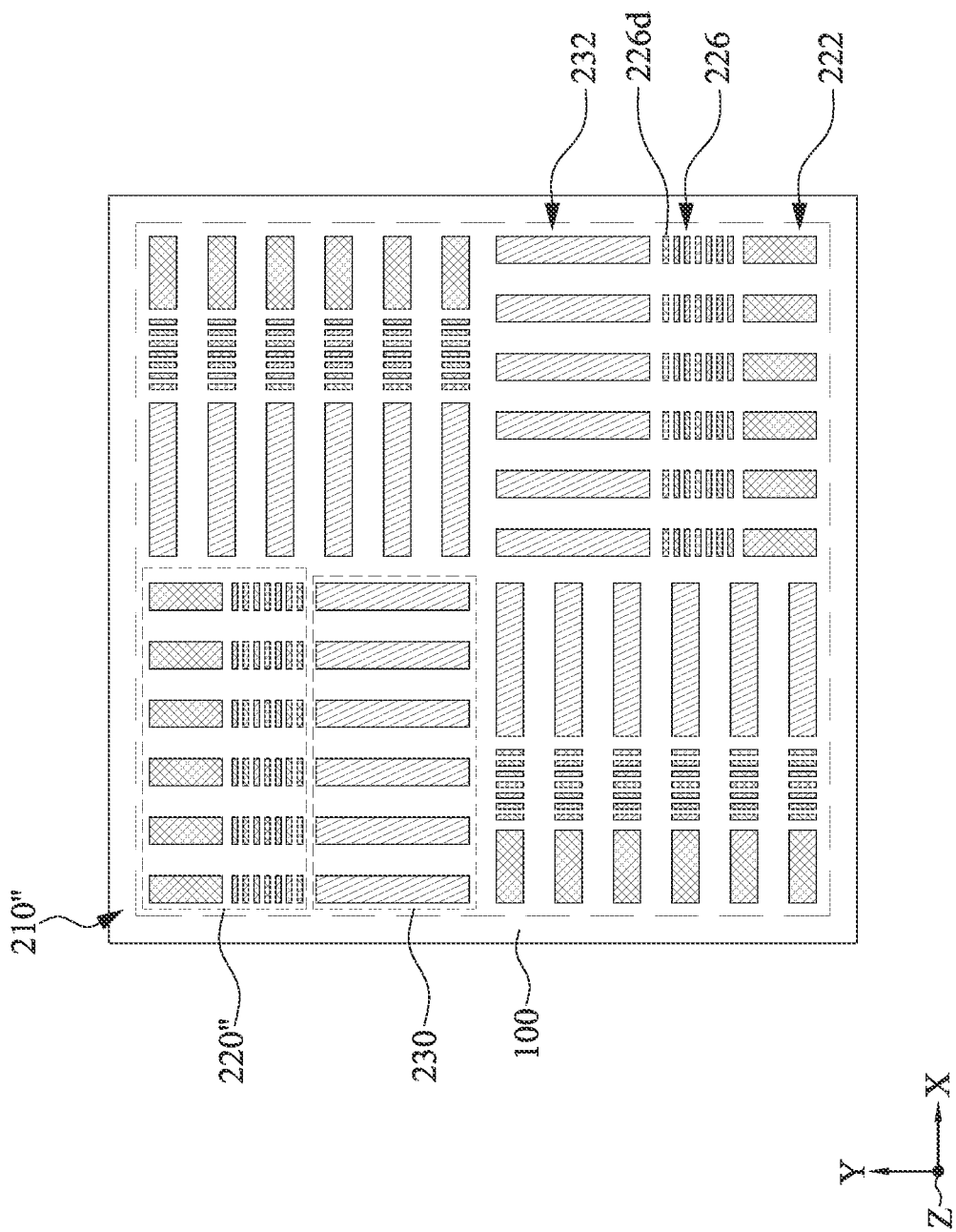
FIG. 7 is a top view of an overlay mark, in accordance with some embodiments of the present disclosure.

FIG. 7 is a top view of an overlay mark 210", in accordance with some embodiments of the present disclosure.

The overlay mark 210" shown in FIG. 7 can be similar to the overlay mark 210 shown in FIG. 5, differing in the composition of the patterns 220". In some embodiments, the etching process can be omitted after the formation of the pre-layer, and the patterns 220" can be composed of the sub-patterns 222 and 226. In this embodiment, the correction parameters, not belong to inter-field rotation, can be selected from the sub-pattern 222 to generate the correction data.

As discussed above, the correction data from different patterns (or sub-patterns) may have different degrees of errors. In this embodiment, the pre-layer can include patterns with different profiles, which can be used to generate a corrected overlay error with a smaller deviation with respect to actual fact. The exposure equipment will be adjusted based on this corrected overlay error, and the accuracy of the alignment between the pre-layer and the current layer will be refined in the next semiconductor fabrication processes.

Figure 8:
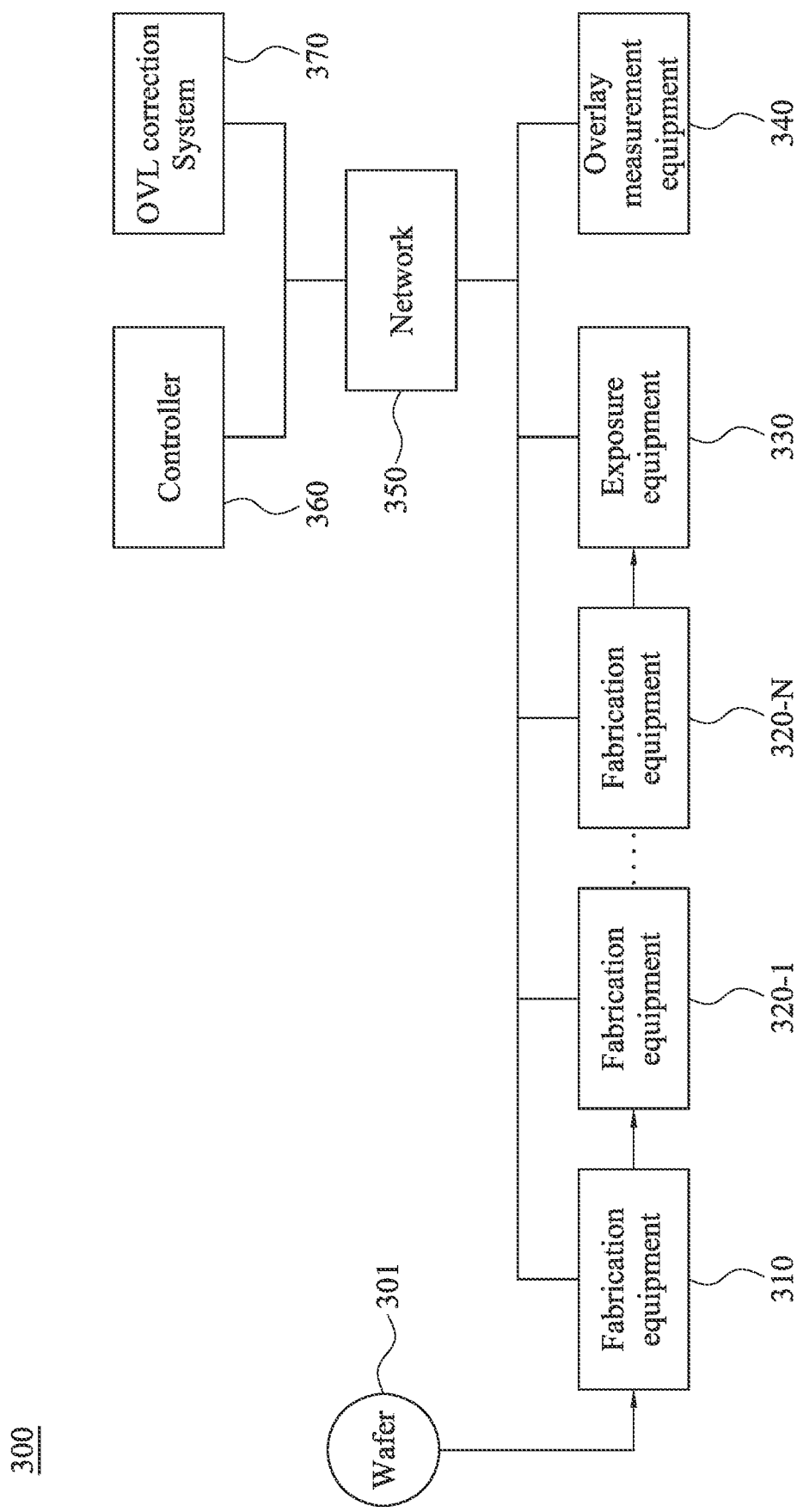
FIG. 8 is a block diagram illustrating a semiconductor fabrication system, in accordance with some embodiments of the present disclosure.

FIG. 8 is a block diagram illustrating a semiconductor fabrication system 300, in accordance with some embodiments of the present disclosure.

The semiconductor fabrication system 300 can include a to plurality of fabrication equip lent 310, 320-1, . . . , and 320-N, exposure equipment 330, as well as overlay measurement equipment 340. The fabrication equipment 310, 320-1, . . . , and 320-N, the exposure equipment 330, and the overlay measurement equipment 340 can be coupled with a controller 360 and an overlay (OVL) correction system 370 through a network 350.

The fabrication equipment 310 can be configured to form the pattern in a pre-layer, such as the patterns 220 shown in FIG. 5. In some embodiments, the fabrication equipment 310 may be configured to form an isolation structure, a gate structure, a conductive via or other layers. The fabrication equipment 320-1, . . . , and 320-N can be configured to form an intermediate structure, such as the intermediate structure 140 shown in FIG. 4A. Each piece of the fabrication equipment 320-1, . . . , and 320-N can be configured to perform a deposition process, an etching process, a chemical mechanical polishing process, photoresist coating process, baking process, an alignment process, or other processes.

The exposure equipment 330 can be configured to form the pattern in a current layer, such as the patterns 230 shown in FIG. 5.

The overlay measurement equipment 340 can be configured to obtain optical images of the patterns of the pre-layer and the current layer, and to generate an overlay error based on the aforesaid optical images of the patterns of the pre-layer and the current layer.

The network 350 can be the internet or an intranet implementing network protocols such as transmission control protocol (TCP). Through the network 350, each piece of fabrication equipment 310, 320-1-320-N, exposure equipment 330 and overlay measurement equipment 340 may download or upload work in progress (WIP) information regarding to the wafer or the fabrication equipment from or to the controller 360 or the overlay correction system 370.

The controller 360 can include a processer, such as a central processing unit (CPU) to generate corrected overlay error based on the overlay measurement equipment 340 and the correction data generated from the overlay correction system 370.

The overlay correction system 370 can include correction parameters associated with the information of the optical images and thus correction data can be generated from the corresponding correction parameters. The overlay correction system 370 can include, for example, a calculator or a server. In some embodiments, the correction data can be generated or calculated by program codes or program languages. In some embodiments, the X-directional deviation ($\Delta X$), the Y-directional deviation ($\Delta Y$), or the combination of both can be generated by an equation involving the correction parameters. Although FIG. 8 illustrates that the overlay correction system 370 is signally connected to the overlay measurement equipment 340 through the network 350, the present disclosure is not intended to be limiting. In other embodiments, the overlay correction system 370 can be a program built within the overlay measurement equipment 340.

Although FIG. 8 does not show any other fabrication equipment before the fabrication equipment 310, the exemplary embodiment is not intended to be limiting. In other exemplary embodiments, various kinds of fabrication equipment can be scheduled before the fabrication equipment 310, and can be used to perform various processes according to the design requirement.

In the exemplary embodiments, a wafer 301 is transferred to the fabrication equipment 310 to start a sequence of different processes. The wafer 301 may be processed by various stages forming at least one layer of material. The exemplary embodiments are not intended to limit the progress of the wafer 301. In other exemplary embodiments, the water 301 may include various layers, or any stages between the beginning and the completion of a product, before the wafer 301 is transferred to the fabrication equipment 310. In the exemplary embodiments, the wafer 301 can be processed by the fabrication equipment 310, 320-1-320-N, exposure equipment 330 and overlay measurement equipment 340 in a sequential order.

Figure 9:
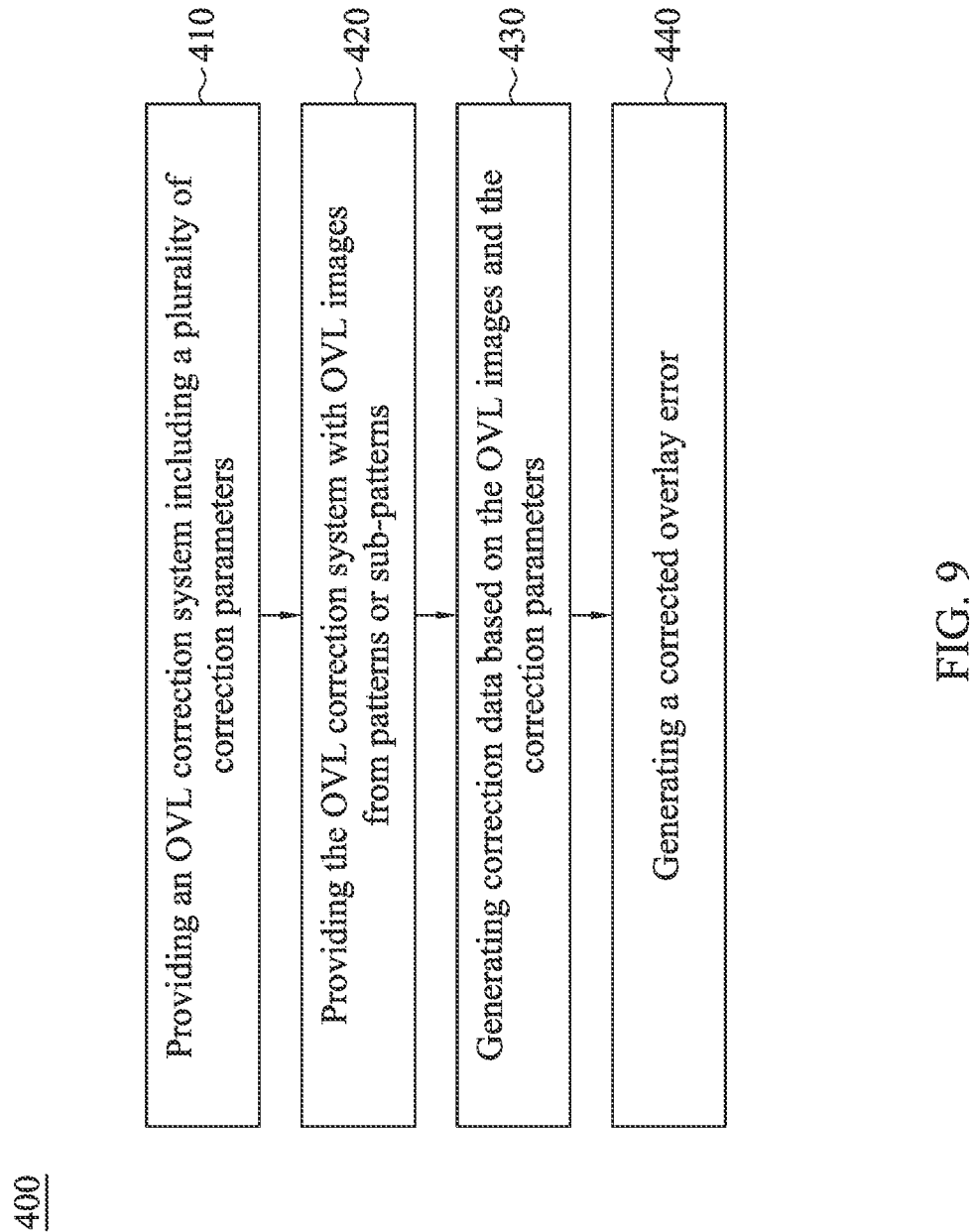
FIG. 9 is a schematic chart illustrating a method for generating correction data by an overlay correction system, in accordance with some embodiments of the present disclosure.

FIG. 9 is a flow chart illustrating a method 400 for generating the correction data by an overlay correction system, in accordance with various aspects of the present disclosure.

The method 400 begins with operation 410 in which an overlay correction system, such as the overlay correction system 370, is provided. In some embodiments, the overlay correction system 370 can include a plurality of correction parameters P1, P2, . . . , and PN, which can be used to generate a corresponding correction data or a corrected overlay error.

The method 400 continues with operation 420 in which the information of optical images is provided. For example, the optical images can be generated from patterns (or sub-patterns) A, B, C, and D, and the information of the optical images can be uploaded to the network. In some embodiments, the patterns or sub-patterns A, B, C, and D can correspond to the sub-patterns 222, sub-patterns 224, sub-patterns 226, and patterns 230, respectively.

The method 400 continues with operation 430 in which correction data are generated. In some embodiments, the pattern (or sub-pattern) A can be used to generate a correction data a1 from the parameter P1, a correction data a2 from the parameter P2, and so on. As a result, correction data a1, a2, . . . , and aN are generated based on the pattern or sub-pattern A and the correction parameters P1-PN. Similarly, correction data b1, b2, . . . , and bN are generated based on the pattern (or sub-pattern B) and the correction parameters P1-PN, correction data c1, c2, . . . , and cN are generated based on the pattern (or sub-pattern) C and the correction parameters P1-PN, and correction data d1, d2, . . . , and dN are generated based on the pattern (or sub-pattern) D and the correction parameters P1-PN.

The method 400 continues with operation 440 in which a corrected overlay error is generated. The corrected overlay error can be generated based on the correction data from the corresponding parameters P1-PN. The corrected overlay error can be represented by an equation involving an X-directional offset value, a Y-directional offset value, or the combination of both and the overlay error generated from the overlay measurement equipment.

In other some embodiments, the operation 430 can be omitted. In this embodiment, the corrected overlay error, including the X-directional deviation ($\Delta X$), the Y-directional deviation ($\Delta Y$), or the combination of both, can be generated from the correction parameters. Each of the X-directional deviation ($\Delta X$), the Y-directional deviation ($\Delta Y$), or the combination of both can be represented by equation(s) involving the correction parameters as variables. When the information of optical images are received, the variables can be determined, thereby generating the X-directional deviation ($\Delta X$), the Y-directional deviation ($\Delta Y$), or the combination of both.

Figure 10:
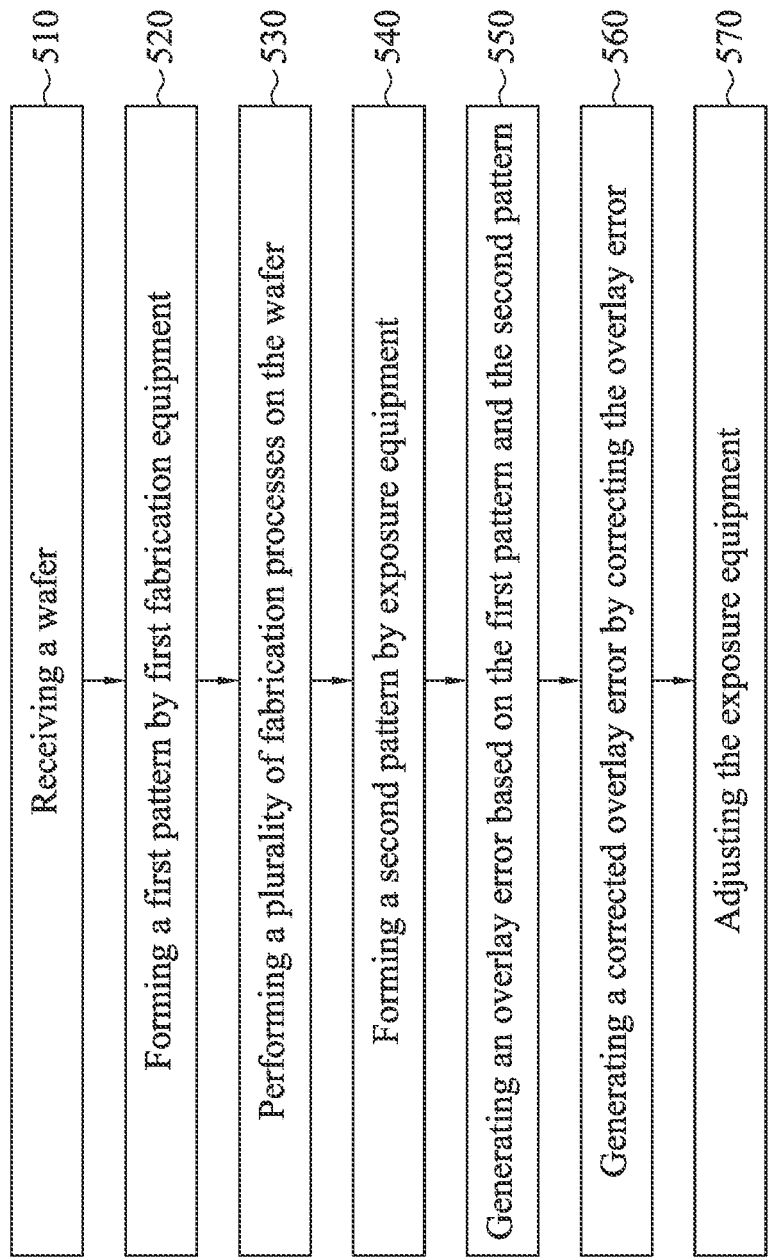
FIG. 10 is a flow chart illustrating a method for overlay error correction, in accordance with various aspects of the present disclosure.
Figure 11:
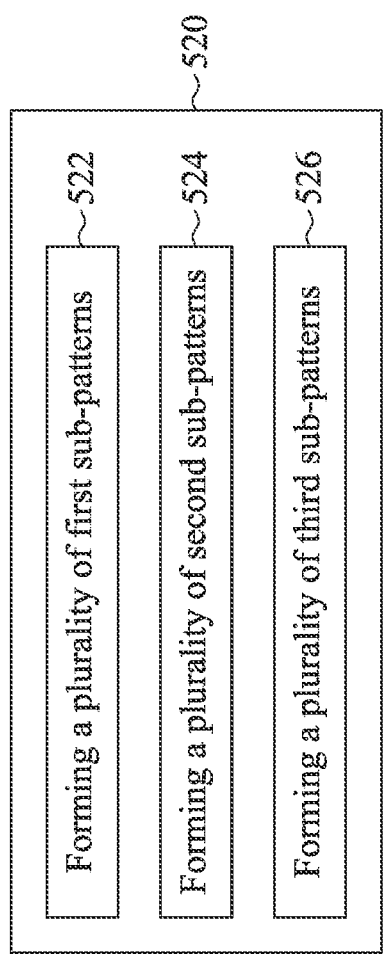
FIG. 11 is a flow chart illustrating a method for overlay error correction, in accordance with various aspects of the present disclosure.
Figure 12:
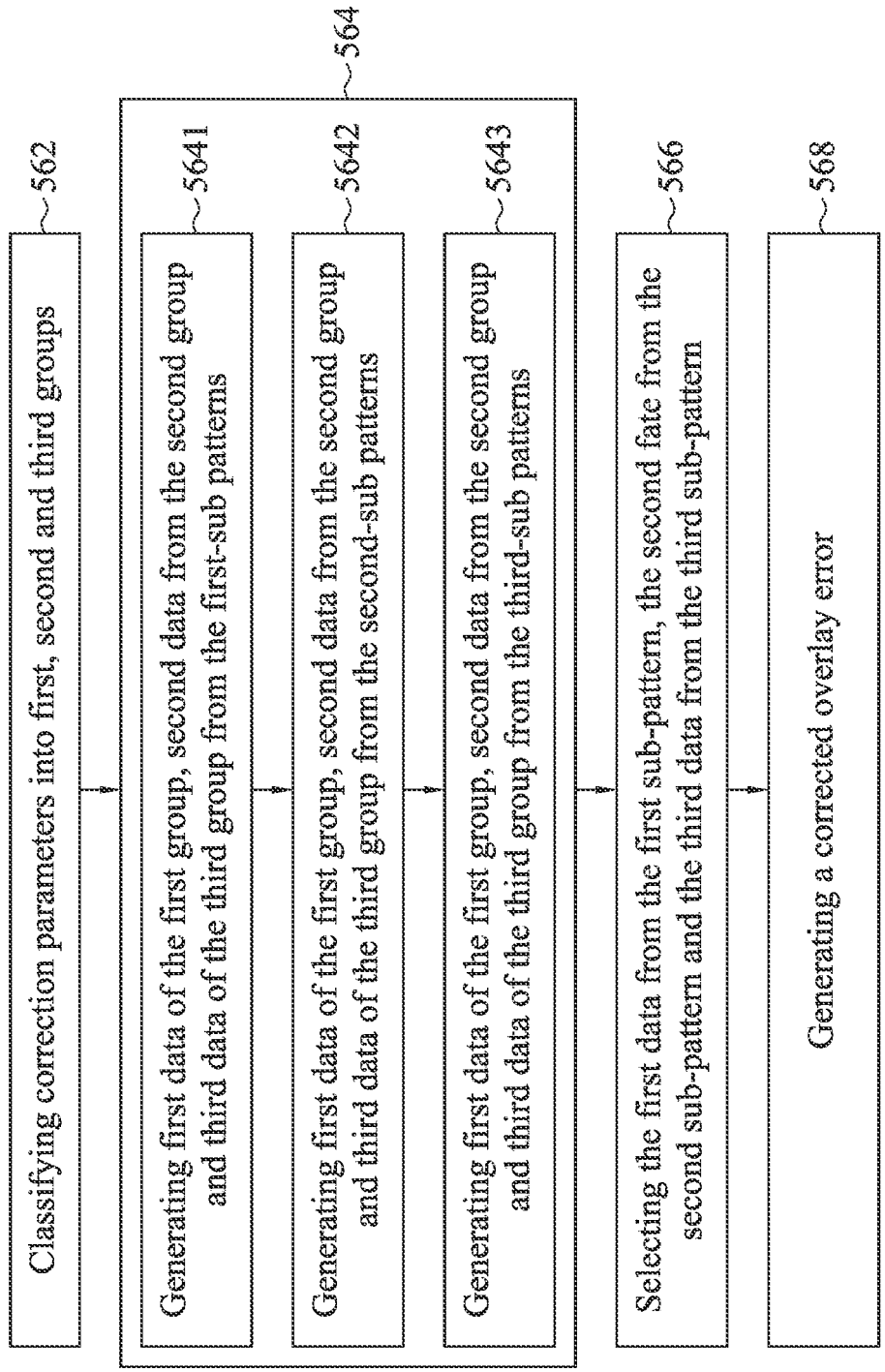
FIG. 12 is a flow chart illustrating a method for overlay error correction, in accordance with various aspects of the present disclosure.

FIG. 10, FIG. 11 and FIG. 12 are flow charts illustrating a method 500 for overlay correction, in accordance with various aspects of the present disclosure.

Referring to FIG. 10, the method 500 begins with operation 510 in which a wafer is received. The wafer 500 can include a semiconductor substrate, such as a silicon substrate. The wafer can include a plurality of dies separated by scribe lines.

The method 500 continues with operation 520 in which a first pattern (e.g., a pre-layer pattern) is formed by a first piece of fabrication equipment. Before formation of the first pattern, multiple processes can be performed on the substrate of the wafer such that there are many features formed beneath the first pattern. In some embodiments, the first pattern can include a dielectric material, a conductive material, or other suitable materials. In some embodiments, the first pattern may be formed in operations configured to form, for example, gate structures, isolation features, conductive vias or other features. In some embodiments, the first pattern can correspond to the patterns 220 shown in FIG. 5.

Referring to FIG. 11, the operation 520 can include operations 522, 524 and 526 in which a plurality of first, second and third sub-patterns are formed. In some embodiments, the first, second and third sub-patterns can be formed simultaneously. In some embodiments, each of the first, second and third sub-patterns can correspond to the sub-patterns 222, 224, and 226, respectively, shown in FIG. 5.

Referring back to FIG. 10, the method 500 continues with operation 530 in which multiple fabrication processes are performed on the substrate of the wafer after the formation of the first pattern. The fabrication processes can be used to form intermediate layers covering the first pattern. The intermediate layers can be formed by multiple pieces of fabrication equipment, which can be used to perform a deposition process, an etching process, a chemical mechanical polishing process, photoresist coating process, baking process, an alignment process, or other processes.

The method 500 continues with operation 540 in which a second pattern (e.g., a current layer) is formed by exposure equipment. In some embodiments, the second pattern can be a pattern of openings of a mask, such as a photoresist. In some embodiments, the second pattern can correspond to the patterns 230 shown in FIG. 5.

The method 500 continues with operation 550 in which an overlay error, related to the shift along the X direction and the Y direction, is generated by overlay measurement equipment. In some embodiments, multiple optical images of the first pattern, including the first, second, third sub-patterns, and the second pattern are generated by the overlay measurement, and an overlay error can be generated based on these optical images. In some embodiments, the overlay error may include the X-directional deviation ($\Delta X$), the Y-directional deviation ($\Delta Y$), or the combination of both.

The method 500 continues with operation 560 in which a corrected overlay error is generated by correcting the overlay error obtained in operation 550. In some embodiments, an X-directional offset value, a Y-directional offset value, or the combination of both, can be generated to compensate the overlay error generated in the operation 550. In some embodiments, the corrected overlay error can be determined or calculated based on operations, such as operation 530, used to form the aforesaid intermediate layers located below the current layer.

Referring to FIG. 12, the operation 560 can include operations 562, 564, 566 and 568. The operation 562 can include classing correction parameters into first, second and third groups. For example, the correction parameters can be classified into a first group related to inter-field expansion, a second group related to inter-field rotation, and a third group not belonging the first and second group.

The operation 564 can include operations 5641, 5642, and 5643 in which a first correction data, a second correction data, and a third correction data are generated from the first, second, and third sub-patterns. Each one of the first, second, or third sub-patterns can be used to generate the first, second, and third correction data. That is, nine units of correction data can be generated based on the first, second, and third sub-patterns. The first, second and third correction data can be correspond to the first, second and third groups, respectively, of the correction parameters.

The operation 566 can include selecting data used to generate a corrected overlay error. In some embodiments, the first correction data is selected from the first sub-pattern, the second correction data is selected from the second sub-pattern, and the third correction data is selected from the third pattern, respectively.

For example, correction parameters P1, P2, . . . , and P9, and parameters P1, P2, and P3 belong to the first group, parameters P4, P5, and P6 belong to the second group, and parameters P7, P8, and P9 belong to the third group. The correction data a1, a2, . . . , and a9 are generated from the first sub-patterns, the correction data b1, b2, . . . , and b9 are generated from the second sub-patterns, and the correction data c1, c2, . . . , and c9 are generated from the third sub-patterns. In this embodiment, the correction data a1, a2, a3, b4, b5, b6, c7, c8 and c9 are selected to generate an X-directional offset value, a Y-directional offset value, or the combination of both. As a result, the correction overlay error can be generated based on the aforesaid offset and the overlay error generated in the operation 550.

In other embodiments, the number of groups of the correction parameters can be determined by the fabrication processes performed on the wafer in the operation 530. In some embodiment, an etching process or a chemical mechanical polishing process can be omitted, and correction parameters can be classified into two groups accordingly. In such a case, if there are correction parameters P1, P2, . . . , and P9, correction data a1-a6 can be selected from the first sub-patterns, and correction data b7-b9 can be selected from the second sub-patterns to generate the correction overlay error. In other embodiments, the number of groups of the correction parameters can be greater than 3 based on how to classify the fabrication processes, thus classifying the correction parameters based on the classified fabrication processes.

The operation 568 can include generating a corrected overlay error based on the overlay error and the selected correction data. The operation 568 can be performed by a controller, such as the controller 360 shown in FIG. 8.

The operations 562, 564, 566, and/or 568 can be performed by an overlay correction system, such as the overlay correction system 370 show n in FIG. 8.

In other embodiments, operations 564, 566, and 566 can be omitted. In this embodiment, the corrected overlay error, including the X-directional deviation ($\Delta X$), the Y-directional deviation ($\Delta Y$), or the combination of both, can be generated from the correction parameters. Each of the X-directional deviation ($\Delta X$), the Y-directional deviation ($\Delta Y$), or the combination of both can be represented by equation(s) involving the correction parameters as variables. For example, correction parameters P1, P2, . . . , and P9, and parameters P1, P2, and P3 belong to the first group, parameters P4, P5, and P6 belong to the second group, and parameters P7, P8, and P9 belong to the third group. The variables involving the correction parameters P1-P3, P4-P6, and P7-P9 can be determined from the optical information of the first sub-patterns, second sub-patterns, and third sub-patterns, respectively. Thus, the corrected overlay error can be determined.

Referring back to FIG. 10, the method 500 continues with operation 570 in which the exposure equipment is adjusted based on the corrected overlay error. In some embodiments, operation 570 can include adjusting a position of a reticle of the exposure equipment so that the next exposure process can be performed with a smaller overlay error.

The method 500 involves classifying the correction parameters into different groups. As discussed above, the correction data from different patterns (or sub-patterns) may have different degrees of errors. In this embodiment, the pre-layer can include patterns with different profiles, which can be used to generate a corrected overlay error with a smaller deviation with respect to actual fact. The exposure equipment will be adjusted based on this corrected overlay error, and the accuracy of the alignment between the pre-layer and the current layer will be refined in the next semiconductor fabrication processes.

The method 500 is merely an example, and is not intended to limit the present disclosure beyond what is explicitly recited in the claims. Additional operations can be provided before, during, or after each operation of the method 500, and some operations described can be replaced, eliminated, or moved around for additional embodiments of the method. In some embodiments, the method 500 can include further operations not depicted in FIGS. 10-12. In some embodiments, the method 500 can include one or more operations depicted in FIGS. 10-12.

Figure 13:
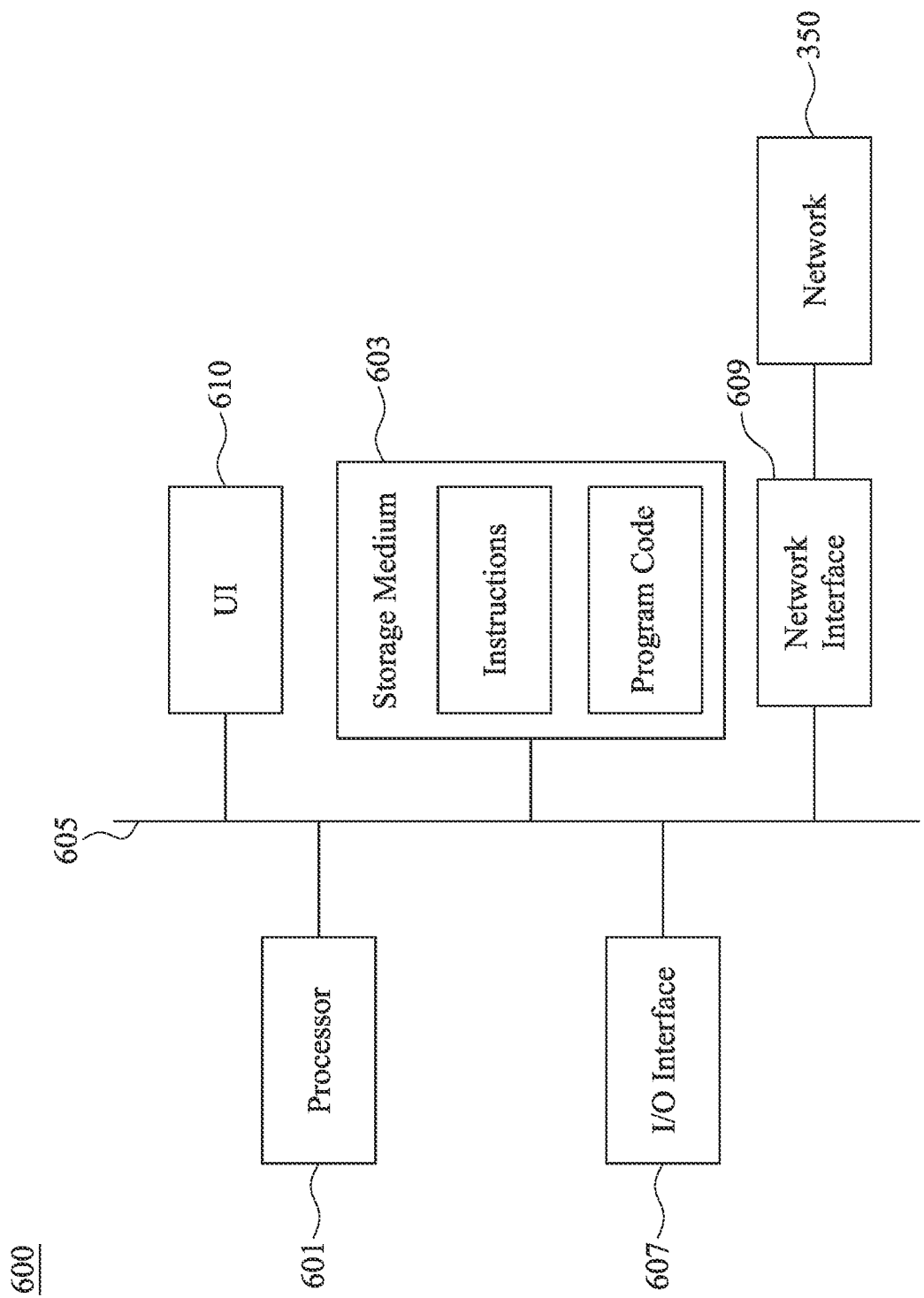
FIG. 13 is a diagram illustrating hardware of a semiconductor fabrication system, in accordance with various aspects of the present disclosure.

The processes illustrated in FIGS. 10-12 may be implemented in the controller 360, or a computing system that organizes the fabrication of wafer by controlling every part or a portion of the fabrication equipment in the facility. FIG. 13 is a diagram illustrating hardware of a semiconductor fabrication system 600, in accordance with various aspects of the present disclosure. The system 600 includes one or more hardware processor 601 and a non-transitory computer readable storage medium 603 encoded with, i.e., storing, the program codes (i.e., a set of executable instructions.) The computer readable storage medium 603 may also be encoded with instructions for interfacing with fabrication equipment for producing the semiconductor device. The processor 601 is electrically coupled to the computer readable storage medium 603 via a bus 605. The processor 601 is also electrically coupled to an I/O interface 607 by the bus 605. A network interface 609 is also electrically connected to the processor 601 via the bus 605. The net work interface is connected to a network, so that the processor 601 and the computer readable storage medium 603 are capable of connecting to external elements via network 350. The processor 601 is configured to execute the computer program code encoded in the computer readable storage medium 605 in order to cause the system 600 to be usable for performing a portion or all of the operations as described in the methods illustrated in FIGS. 10-12.

In some exemplary embodiments, the processor 601 can be, but is not limited to, a central processing unit (CPU), a multi-processor, a distributed processing system, an application specific integrated circuit (ASIC), and/or a suitable processing unit. Various circuits or units are within the contemplated scope of the present disclosure.

In some exemplary embodiments, the computer readable storage medium 603 can be, but is not limited to, an electronic, magnetic, optical, electromagnetic, infrared, and/or a semiconductor system (or apparatus or device). For example, the computer readable storage medium 603 includes a semiconductor or solid-state memory, a magnetic tape, a removable computer diskette, a random access memory (RAM), a read-only memory (ROM), a rigid magnetic disk, and/or an optical disk. In one or more exemplary embodiments using optical disks, the computer readable storage medium 603 also includes a compact disk-read only memory (CD-ROM), a compact disk-read/write (CD-R/W), and/or a digital video disc (DVD).

In some exemplary embodiments, the storage medium 603 stores the computer program code configured to cause system 600 to perform methods illustrated in FIGS. 8-12. In one or more exemplary embodiments, the storage medium 601 also stores information needed for performing the methods illustrated in FIGS. 8-12 as well as information generated during performing the methods and/or a set of executable instructions to perform the operation of methods illustrated in FIGS. 8-12. In some exemplary embodiments, a user interface 610, e.g., a graphical user interface (GUI), may be provided for a user to operate on the system 600.

In some exemplary embodiments, the storage medium 603 stores instructions for interfacing with external machines. The instructions enable processor 601 to generate instructions loadable by the external machines to effectively implement the methods illustrated in FIGS. 8-12 during an analysis.

System 600 includes input and output (I/O) interface 607. The I/O interface 607 is coupled to external circuitry. In some exemplary embodiments, the I/O interface 607 can include, but is not limited to, a keyboard, keypad, mouse, trackball, track-pad, touch screen, and/or cursor direction keys for communicating information and commands to processor 601.

In some exemplary embodiments, the I/O interface 607 can include a display, such as a cathode ray tube (CRT), liquid crystal display (LCD), a speaker, and so on. For example, the display shows information.

System 600 can also include a network interlace 609 coupled to the processor 601. The network interface 609 allows system 600 to communicate with network 350, to which one or move other computer systems are connected. For example, the system 600 may be connected to the fabrication equipment 310, 320-1, . . . , and 320-N, exposure equipment, overlay measurement equipment 340, and overlay correction system 370 through the network interface 609 connecting to the network 350.

One aspect of the present disclosure provides a mark for overlay correction. The mark includes a first pattern and a second pattern. The first pattern is disposed on a substrate and at a first horizontal level. The first pattern includes a plurality of first sub-patterns and a plurality of second sub-patterns. The first sub-patterns extend along a first direction and are arranged along a second direction different from the first direction. The second sub-patterns are arranged along the second direction, wherein a profile of each of the plurality of first sub-patterns is different from a profile of each of the plurality of second sub-patterns. The second pattern is disposed at a second horizontal level different from the first horizontal level.

Another aspect of the present disclosure provides a method for overlay error correction. The method includes: obtaining an overlay error based on a lower-layer pattern and an upper-layer pattern of a wafer, wherein the lower-layer pattern is obtained by a first piece of fabrication equipment through which the wafer passes, and the upper-layer pattern is obtained by exposure equipment; generating a corrected overlay error based on the overlay error and fabrication processes performed on the wafer after the first piece of fabrication equipment and prior to the exposure equipment; and adjusting the exposure equipment based on the corrected overlay error.

Another aspect of the present disclosure provides a method for overlay error correction. The method includes: receiving a wafer having a substrate; forming a first pattern on the substrate of the wafer; performing a plurality of fabrication processes on the wafer; forming, by exposure equipment, a second pattern on the first pattern of the wafer; obtaining an overlay error based on the first pattern and the second pattern of the wafer; generating a corrected overlay error based on the overlay error and the plurality of fabrication processes; and adjusting the exposure equipment based on the corrected overlay error.

The embodiments of the present disclosure disclose an overlay mark for overlay error measurement. The pre-layer of the overlay mark can include different sub-patterns so that correction data can be generated from each of the sub-patterns. Selecting correction data from a specific sub-pattern can refine a correction overlay error, resulting in the corrected overlay error being more in accordance with actual fact.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method for overlay error correction, comprising:
obtaining an overlay error based on a lower-layer pattern and an upper-layer pattern of a wafer, wherein the lower-layer pattern is obtained by first fabrication equipment through which the wafer passes, and the upper-layer pattern is obtained by exposure equipment;
generating a corrected overlay error based on the overlay error and fabrication processes perforated on the wafer after the first fabrication equipment and prior to the exposure equipment; and
adjusting the exposure equipment based on the corrected overlay error.

2. The method of claim 1, wherein the lower-layer pattern comprises a plurality of first sub-patterns and a plurality of second sub-patterns, and a profile of each of the plurality of first sub-patterns is different from a profile of each of the plurality of second sub-patterns.

3. The method of claim 2, wherein generating the corrected overlay error comprises:
classifying a plurality of correction parameters into a first group and a second group;
obtaining a first corresponding data of the first group of the plurality of correction parameters from the plurality of first sub-patterns, and a second corresponding data of the second group of the plurality of correction parameters from the plurality of second sub-patterns, respectively; and
generating the corrected overlay error based on the overlay error, the first corresponding data and the second corresponding data.

4. The method of claim 3, further comprising:
obtaining a third corresponding data of the first group of the plurality of correction parameters from the plurality of second sub-patterns and a fourth corresponding data of the second group of the plurality of correction parameters from the plurality of second sub-patterns; and selecting the first corresponding data and the second corresponding data to determine the corrected overlay error.

5. The method of claim 2, wherein a pitch of the plurality of second sub-patterns is different from a pitch of the plurality of first sub-patterns.

6. The method of claim 2, wherein in a plain view, each of the plurality of second sub-patterns extends along a third direction different from the first direction and the second direction.

7. The method of claim 2, wherein each of the plurality of second sub-patterns comprises a plurality of segments arranged along the first direction.

8. The method of claim 2, wherein in a plain view, a size of each of the plurality of second sub-patterns is different from a size of each of the plurality of first sub-patterns.

9. The method of claim 2, wherein the number of the plurality of second sub-patterns is different from the number of the plurality of first sub-patterns.

10. The method of claim 1, wherein the fabrication processes comprise at least one of an etching process, a deposition process, and a chemical mechanical polishing process.

11. The method of claim 1, wherein adjusting the exposure equipment comprises adjusting a position of a reticle of the exposure equipment.

12. A method for overlay error correction, comprising:
receiving a wafer having a substrate;
forming a first pattern on the substrate of the wafer;
forming an intermediate structure covering the first pattern;
forming, by exposure equipment, a second pattern on the intermediate structure;
obtaining an overlay error based on the first pattern and the second pattern of the wafer;
generating a corrected overlay error based on the overlay error; and
adjusting the exposure equipment based on the corrected overlay error.

13. The method of claim 12, wherein forming the first pattern comprises:
forming a plurality of first sub-patterns; and
forming a plurality of second sub-patterns, wherein a profile of each of the plurality of first sub-patterns is different from a profile of each of the plurality of second sub-patterns.

14. The method of claim 12, wherein generating the corrected overlay error comprises:
classifying a plurality of correction parameters into a first group and a second group;
obtaining a first corresponding data of the first group of the plurality of correction parameters from the plurality of first sub-patterns and a second corresponding data of the second group of the plurality of correction parameters from the plurality of second sub-patterns, respectively; and
generating the corrected overlay error based on the overlay error, the first corresponding data and the second corresponding data.

15. The method of claim 14, further comprising:
obtaining a third corresponding data of the first group of the plurality of correction parameters from the plurality of second sub-patterns and a fourth corresponding data of the second group of the plurality of correction parameters from the plurality of second sub-patterns; and
selecting the first corresponding data and the second corresponding data to determine the corrected overlay error.

16. The method of claim 13, wherein in a plain view, each of the plurality of second sub-patterns extends along a third direction different from the first direction and the second direction, each of the plurality of second sub-patterns comprises a plurality of segments arranged along the first direction, and a pitch of the plurality of second sub-patterns is different from a pitch of the plurality of first sub-patterns.

17. The method of claim 13, wherein in a plain view, a size of each of the plurality of second sub-patterns is different from a size of each of the plurality of first sub-patterns, and the number of the plurality of second sub-patterns is different from the number of the plurality of first sub-patterns.

18. The method of claim 12, wherein the intermediate structure is formed by fabrication processes comprising at least one of an etching process, a deposition process, and a chemical mechanical polishing process.

19. The method of claim 12, wherein adjusting the exposure equipment comprises adjusting a position of a reticle of the exposure equipment.

* * * * *